(12) United States Patent  
Wu et al.

(10) Patent No.: US 10,755,961 B2  
(45) Date of Patent: Aug. 25, 2020

(54) SEMICONDUCTOR TOOL WITH A SHIELD

(71) Applicant: Taiwan Semiconductor Manufacturing Company, Ltd., Hsinchu (TW)

(72) Inventors: Tzung-Chen Wu, Hsinchu (TW); Tzu Wei Yu, New Taipei (TW); Cheng Yu Wu, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/504,129

(22) Filed: Jul. 5, 2019

(65) Prior Publication Data

US 2019/0326151 A1   Oct. 24, 2019

Related U.S. Application Data

(62) Division of application No. 15/474,792, filed on Mar. 30, 2017, now Pat. No. 10,354,908.

(60) Provisional application No. 62/427,660, filed on Nov. 29, 2016.

(51) Int. Cl.
| | |
|---|---|
| *H01L 21/687* | (2006.01) |
| *H01L 21/67* | (2006.01) |
| *B25J 11/00* | (2006.01) |
| *B25J 15/00* | (2006.01) |
| *H01L 21/677* | (2006.01) |

(52) U.S. Cl.
CPC ..... *H01L 21/68707* (2013.01); *B25J 11/0095* (2013.01); *B25J 15/0014* (2013.01); *H01L 21/67017* (2013.01); *H01L 21/67742* (2013.01)

(58) Field of Classification Search
CPC ......... H01L 21/68707; H01L 21/67742; H01L 21/67017; B25J 15/0014; B25J 11/0095
See application file for complete search history.

(56) References Cited

U.S. PATENT DOCUMENTS

| | | |
|---|---|---|
| 5,990,453 A | 11/1999 | Das et al. |
| 2010/0320081 A1 | 12/2010 | Mayer et al. |
| 2017/0125272 A1 | 5/2017 | van Gogh et al. |

*Primary Examiner* — Anthony Ho  
(74) *Attorney, Agent, or Firm* — Slater Matsil, LLP

(57) ABSTRACT

A method includes loading a wafer onto a robot arm, wherein a shield is disposed over the wafer, moving the wafer from a first location to a second location, and unloading the wafer from the robot arm.

20 Claims, 9 Drawing Sheets

SEMICONDUCTOR TOOL WITH A SHIELD

PRIORITY CLAIM AND CROSS-REFERENCE

This application is a divisional of U.S. patent application Ser. No. 15/474,792, filed on Mar. 30, 2017, entitled "Semiconductor Tool With A Shield," which claims priority to U.S. Provisional Patent Application No. 62/427,660, filed on Nov. 29, 2016, entitled "Semiconductor Tool With A Shield," which applications are hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

As feature size continues to shrink, tolerance for dust particles in the production environment (e.g., dust on the wafer surfaces) may decrease. In advanced process technologies, small dust particles may cause device defect and lower production yield.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
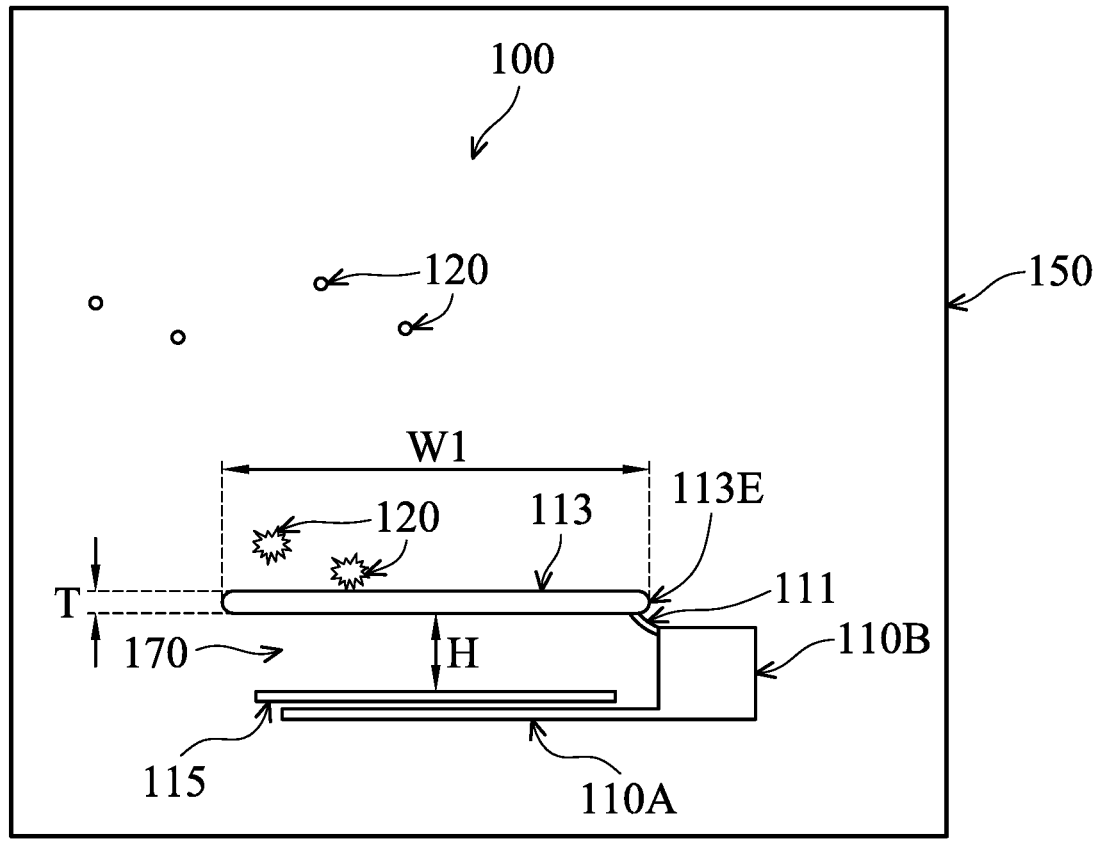
FIG. 1 illustrates a side view of a production tool, in accordance with an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor fab may comprise a variety of apparatuses or production tools such as steppers, immersion scanners, deposition chambers, etching chambers, and the like. In addition, the fab may have a plurality of stockers for storing wafers. The fab is automated by using automatic guided vehicles to transport wafers using robots (e.g., robot arms) to load wafers into the apparatuses or production tools, or to move a wafer within a production tool, such as between different process chambers of the production tool. Dust particles may fall on the wafer surfaces during transportation of the wafers.

As semiconductor manufacturing process moves to more advanced technologies, features sizes formed on the wafer become so small that dust particles on wafer surfaces may interfere with the photolithography process and change the patterns of the integrated circuits (ICs) formed, thereby causing defects in the ICs.

Clean room, or clean room environment is used for semiconductor manufacturing and may refer to an environment with low level of environmental pollutants such as dust particles, airborne microbes, aerosol particles, chemical vapors, and the like. The discussion herein may refer to the pollutants as dust particles, with the understanding that dust particles may refer to various types of airborne particles that may adversely affect the semiconductor manufacturing. A clean room has a controlled level of contamination that is specified by the number of particles per cubic meter at a specified particle size. For example, an ISO 4 clean room allows for about 13,000 particles per cubic meter that is 0.3 µm or smaller, and an ISO 1 cleanroom allows only twelve particles per cubic meter that is 0.3 µm or smaller. Clean rooms are typically equipped with fans, pumps, filters, and other equipment to maintain a desired level of clean room environment.

Despite the effort to keep the fab environment clean, there may still be dust particles in the fab environment or the production tools. Embodiments of the present disclosure include production tools (e.g., robot arms) with a shield to prevent or reduce the amount of dust particles falling on the wafer surfaces.

FIG. 1 illustrates a side view of a production tool 100 disposed in a chamber 150, in some embodiments. The production tool 100 includes a robot arm 110 (e.g., 110A/110B) and a shield 113 attached to the robot arm 110. As illustrated in FIG. 1, the robot arm 110 has an arm 110A attached to a base 110B. The arm 110A is configured to hold a wafer 115. The arm 110A may have various features or mechanisms to accommodate loading the wafer 115 onto the arm 110A, unloading the wafer 115 from the arm 110A, and securely holding the wafer 115 during transportation of the wafer 115 from a first location (e.g., a first chamber in a production tool) to a second location (e.g., a second chamber in the production tool). For example, the arm 110A may have guide pins, mechanical clamps, and/or vacuum mechanism for accommodating the above described functions. Note that not all of the components of the robot arm 110 are illustrated in FIG. 1.

As illustrated in FIG. 1, a shield 113 (may also be referred to as a cover) is attached to the robot arm 110, e.g., via an attachment 111. The shield 113 is positioned over (e.g., directly above) the wafer 115, in some embodiments. The shield 113 is made of an anti-static material, such as quartz, anti-static polyvinyl chloride (PVC), the like, or combinations thereof, in some embodiments. For example, the shield 113 may be made of a bulk piece of non-static material (e.g., quartz or anti-static PVC), and includes little or no other material. In other embodiments, the shield 113 may comprise a substrate with an anti-static coating covering exterior surfaces (e.g., upper surface, lower surface, sidewalls) of the substrate, where the substrate may be any suitable material that provides a pre-determined level of rigidity, such as silicon, glass, ceramic, polymer, the like, or combinations thereof, and the anti-static coating may be any suitable anti-static coating material, such as indium tin oxide, conductive (e.g., electrically conductive) fibers, conductive polymers, and nanomaterials (e.g., polyaniline nanofibers), the like, or combinations thereof. In some embodiment, the anti-static coating has a thickness between about 500 nm to about 1500 nm. Since the shield 113 is attached to the robot arm 110, the shield 113 moves with the robot arm 110 during transportation of a wafer, in some embodiments. Although the shield 113 is illustrated to be attached to the base 110B of the robot arm 110 in the example of FIG. 1, the shield 113 may be separate from (e.g., not attached to) the robot arm 110 and attached to other component (not shown) of the production tool 100, and the shield 113 may move with the robot arm 110 such that the shield 113 is disposed over the wafer 115, e.g., while the wafer 115 is being transported.

Still referring to FIG. 1, the shield 113 has rounded edges 113E in the cross-sectional view of FIG. 1. Since electrostatic charge tends to build up along sharp edges, having rounded edges 113E helps to prevent or reduce the electrostatic charge build-up on the shield 113, which reduces the amount of dust particles attracted toward the shield 113, thus reducing the amount of dust particles on the wafer 115, in some embodiments. In accordance with an embodiment, a thickness T of the shield 113 is equal to or larger than about 3 millimeter (mm). In the illustrated embodiment, an upper surface of the shield 113 distal the arm 110A (e.g., facing away from the wafer 115) is parallel to a lower surface of the shield 113 opposing the upper surface, and the upper surface and the low surface of the shield 113 are parallel to a major surface of the wafer 115. A distance H between the shield 113 and the robot arm 110A, measured between the lower surface of the shield 113 facing the wafer 115 and an upper surface of the arm 110A facing the shield 113, is less than about 3 centimeter (cm), in some embodiments. The distance H indicates the size of the gap 170 between the shield 113 and the wafer 115, and a small gap size (e.g., smaller than 3 cm) may help to reduce the possibility that dust particles enter the gap 170 and land on the upper surface of the wafer 115.

As illustrated in FIG. 1, the robot arm 110 and the shield 113 are disposed inside the chamber 150. The chamber 150 may be the housing of a production tool comprising robot arm 110 and the shield 113, as an example. As another example, the chamber 150 may represent the enclosure of the fab environment. The chamber 150 provides a clean room environment for semiconductor manufacturing, in some embodiments.

FIG. 1 also illustrates dust particles 120 in the chamber 150. As the dust particles 120 drift and fall, the shield 113 protects the wafer 115 and reduces the amount of dust particles that reach the wafer 115, thereby reducing defects in the semiconductor devices formed in or on the wafer 115 and improving the yield of the production.

Figure 2:
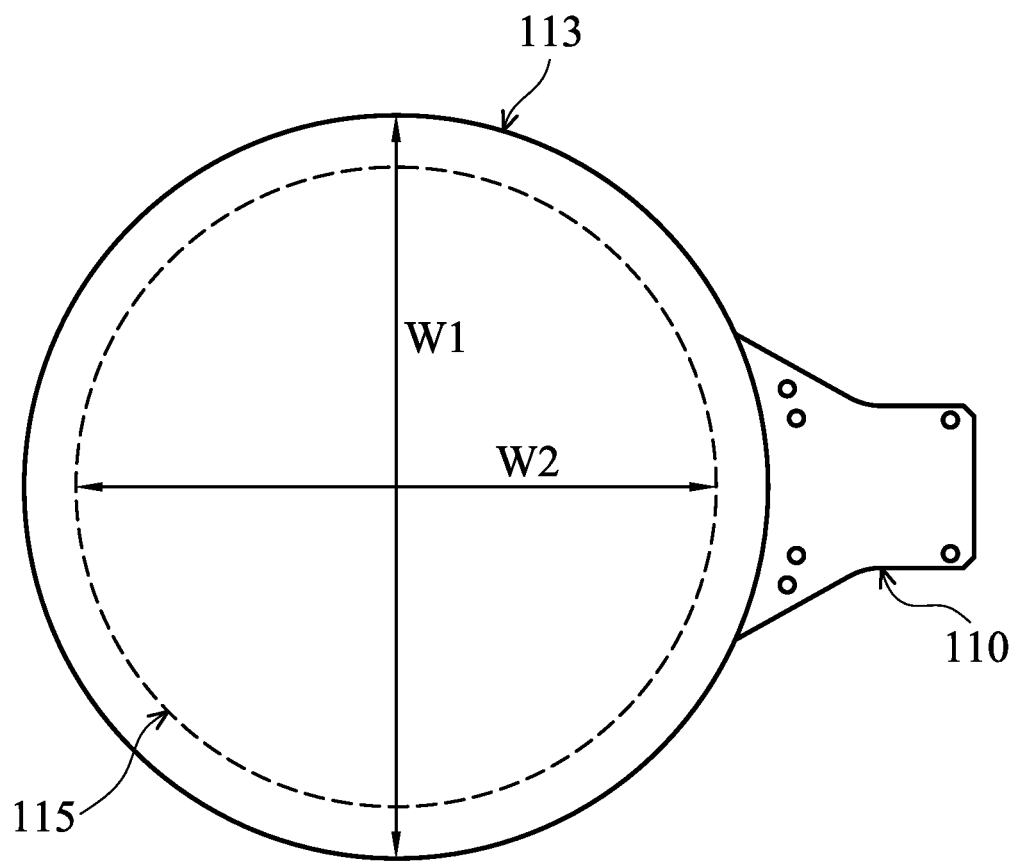
FIG. 2 illustrates a top view of the production tool of FIG. 1, in accordance with an embodiment.

FIG. 2 illustrates a top view of the production tool 100 of FIG. 1, in accordance with an embodiment. In a top view, the shield 113 has a larger surface area than that of the wafer 115 to provide sufficient protection of the wafer 115 from the dust particles, in some embodiments. In some embodiments, the surface area of the shield 113 is at least about 44% larger than the surface area of the wafer 115 in a top view. In the example of FIG. 2, the shield 113 has a circular shape, and the wafer 115 is shown in phantom. The diameter W1 (may also be referred to as a width W1) of the shield 113 is larger than the diameter W2 of the wafer 115 in the illustrated example. In some embodiments, the diameter W1 is at least 20% larger than the diameter W2 to provide sufficient coverage without unduly limiting the mobility or access to the wafer. Although the shield 113 in FIG. 2 is illustrated as having a circular shape, other suitable shapes, such as polygons (e.g., rectangles, pentagons, hexagons, octagons), ovals, semi-circles, elliptical, the like, or combinations therefore, may also be used and are fully intended to be included within the scope of the present disclosure. In some embodiments, a distance from the center of the wafer 115 to a closest edge of the shield 113 in a top view may be larger than a radius of the wafer 115 by a pre-determined amount (e.g., greater than about 20%).

Figure 3:
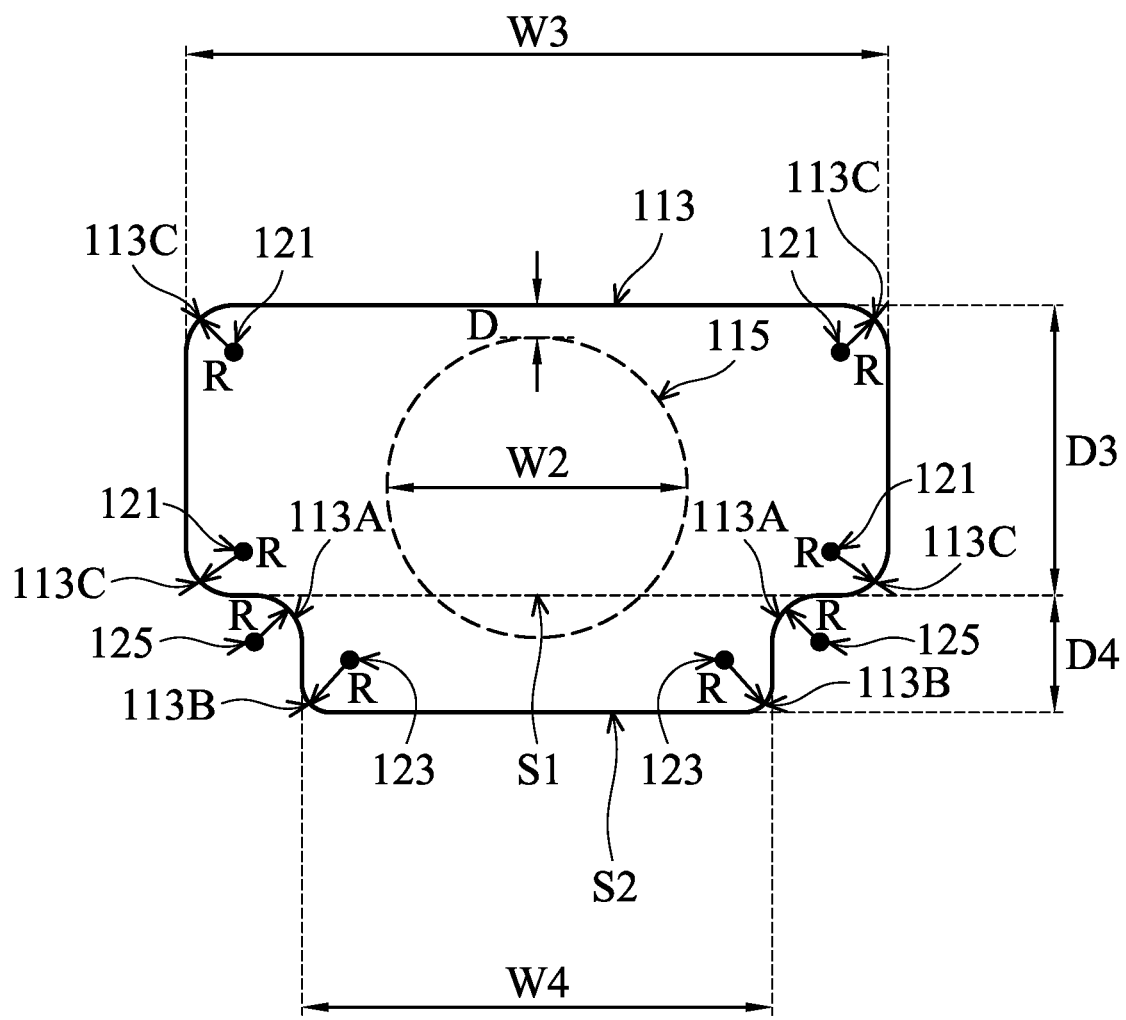
FIG. 3 illustrates a top view of the shield of the production tool of FIG. 1, in accordance with another embodiment.

FIG. 3 illustrates a top view of the shield 113, in accordance with another embodiment. The wafer 115 is shown in phantom in FIG. 3. In some embodiments, the shield 113, when viewed from the top (e.g., in a top view), has rounded corners 113 (e.g., 113A/113B/113C) for all of the corners of the shield 113. Rounded corners may reduce the build-up of electrostatic charge on the shield 113, thus reducing attraction of dust particles and the number of dust particles on the upper surface of the wafer 115.

As illustrated in FIG. 3, the shape of the shield 113 resembles a concave polygon with rounded corners 113. A concave polygon is a polygon having at least one internal angle that is larger than 180 degrees. In particular, the shape of the shield 113 in FIG. 3 comprises two portions. A first portion (the portion above line S1) of the shield 113 resembles a first rectangle having a width W3 and a depth D3, and four rounded corners 113C. Each of the rounded corners 113C may be an arc that is a portion of a circle with a radius R and a center 121. The centers 121 of the four rounded corners 113C are located inside the first portion of the shield 113, in the illustrated embodiment. A second portion (e.g., the portion below line S1) of the shield 113 resembles a second rectangle having a width W4 and depth D4, and four rounded corners (e.g., rounded corners 113A and rounded corners 113B). Each of the four rounded corners of the second portion of the shield 113 may be an arc that is a portion of a circle with a radius R and a center (e.g., centers 123 and centers 125). In particular, the two rounded corners 113B have centers 123 that are located inside the second portion of the shield 113. In contrast, the two rounded corners 113C have centers 125 that are located outside the second portion of the shield 113. The radius R of the rounded corners 113 is larger than about 5 mm, in some embodiments, although other dimensions may also be possible.

In the illustrated example, the width W3 is larger than the width W4, and the depth D3 is larger than the depth D4, although other relations between the dimensions of the first portion and the dimensions of the second portion are also possible. The attachment 111 (see FIG. 1) may be attached to the second portion (e.g., proximate edge S2) of the shield 113 at one end, and the robot arm 110 at another end.

As shown in the top view of FIG. 3, the shield 113 has a surface area larger than the surface area of the wafer 115. In the top view of FIG. 3, a distance D between the edge of the wafer 115 and a closest edge of the shield 113 is larger than 20% of the radius (e.g., half of the diameter W2) of the wafer 115.

Figure 4:
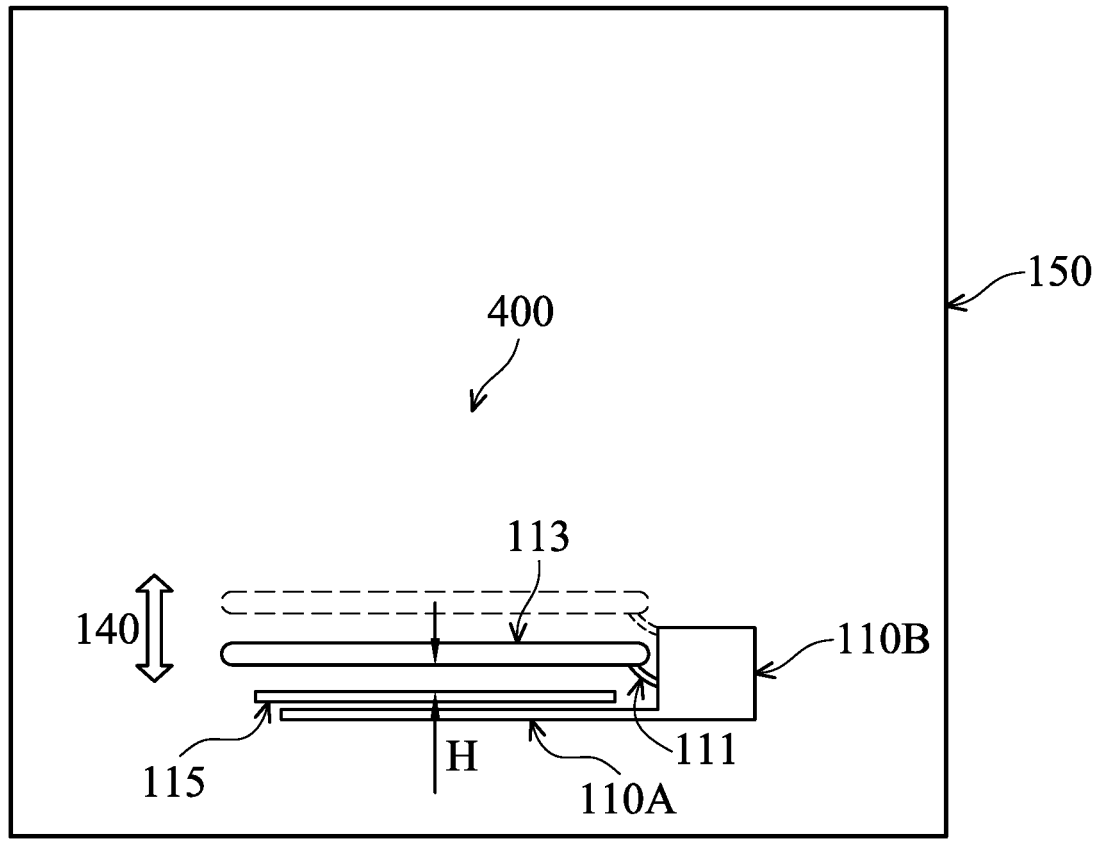
FIGS. 4, 5A, 5B and 6 illustrate side views of various production tools, in accordance with some embodiments.

FIG. 4 illustrates a side view of a production tool 400 disposed in a chamber 150, in some embodiments. Similar numerals in FIG. 4 denote similar components as in FIG. 1. For example, the shield 113 in FIG. 4 is similar to the shield 113 in FIG. 1.

As illustrated in FIG. 4, the production tool 400 includes a robot arm 110 (e.g., 110A/110B) and a shield 113. The robot arm 110 has an arm 110A attached to a base 110B, and the shield 113 is attached to the robot arm 110, in some embodiments. The robot arm 110, the shield 113, and the wafer 115 are disposed in a chamber 150 which provides a clean room environment for semiconductor manufacturing. The shield 113 may have any suitable shapes, such as a circular shape, a polygon shape, an oval shape, an elliptical shape, a semi-circle shape, the like, or combinations therefore. Details of the shield 113 are discussed above with reference to FIGS. 1-3, thus are not repeated here.

In the example of FIG. 4, the shield 113 is attached to the robot arm 110 via the attachment 111. The attachment 111 is attached to the base 110B of the robot arm 110 via an adjustable mechanical mechanism such that the attachment 111 (and the shield 113) can move up and down (e.g., along the direction of the arrow 140 in FIG. 4). For example, the attachment 111 and/or the adjustable mechanical mechanism may be coupled to an electrical motor (not shown) such as a precision step motor that is controlled by a controller (e.g., a micro-controller or a motor-drive controller, not shown). The electrical motor drives the attachment 111 and/or the adjustable mechanical mechanism to change the distance H between the shield 113 and the robot arm 110A. FIG. 4 shows that the shield 113 and the attachment 111 at a higher position in phantom.

Although the example of FIG. 4 shows the shield 113 being attached to the base 110B, the shield 113 may be attached to other portions of the robot arm 110. In addition, although the attachment 111 is shown in FIG. 4 as being attached to a lower surface of the shield 113, the attachment 111 may be attached to other portions of the shield 113. Besides electrical motor, any other suitable driving mechanism may be used to move the shield 113 up and down along the direction of the arrow 140. These and other modifications of the production tool (e.g., production tool 400) are fully intended to be included within the scope of the present disclosure.

In the illustrated embodiment of FIG. 4, the distance H between the shield 113 and the arm 110A is adjustable. The shield 113 may be raised (e.g., away from the arm 110A) to a higher position with a first value (e.g., about 3 cm) for the distance H during loading and unloading of the wafer 115. Having a larger clearance between the shield 113 and the arm 110A may facilitate the loading and unloading of the wafer 115. Once the wafer 115 is loaded onto the arm 110A, the shield 113 may be lowered (e.g., toward the arm 110A) such that the distance H is reduced from the first value to a second value (e.g., smaller than 0.5 cm) smaller than the first value. Reducing the distance H reduces the gap between the shield 113 and the wafer 115, thus advantageously reducing the probability that dust particles enter the gap and land on the surface of the wafer 115. During transportation of the wafer 115 from a first location to a second location, the distance H might remain at the second value. The second value of the distance H may be determined such that the shield 113 is close to but does not contact the wafer 115. Once the wafer 115 arrives at the destination (e.g., the second location), the shield 113 may be raised to a position with a third value for the distance H in preparation for the unloading of the wafer 115. The third value is larger than the second value, and may or may not be the same as the first value, in various embodiments. In some embodiments, the first value, the second value and the third value for the distance H are smaller than about 3 cm. In some embodiments, the distance H is smaller than about 3 cm during normal operation of the production tool.

Figure 5A:
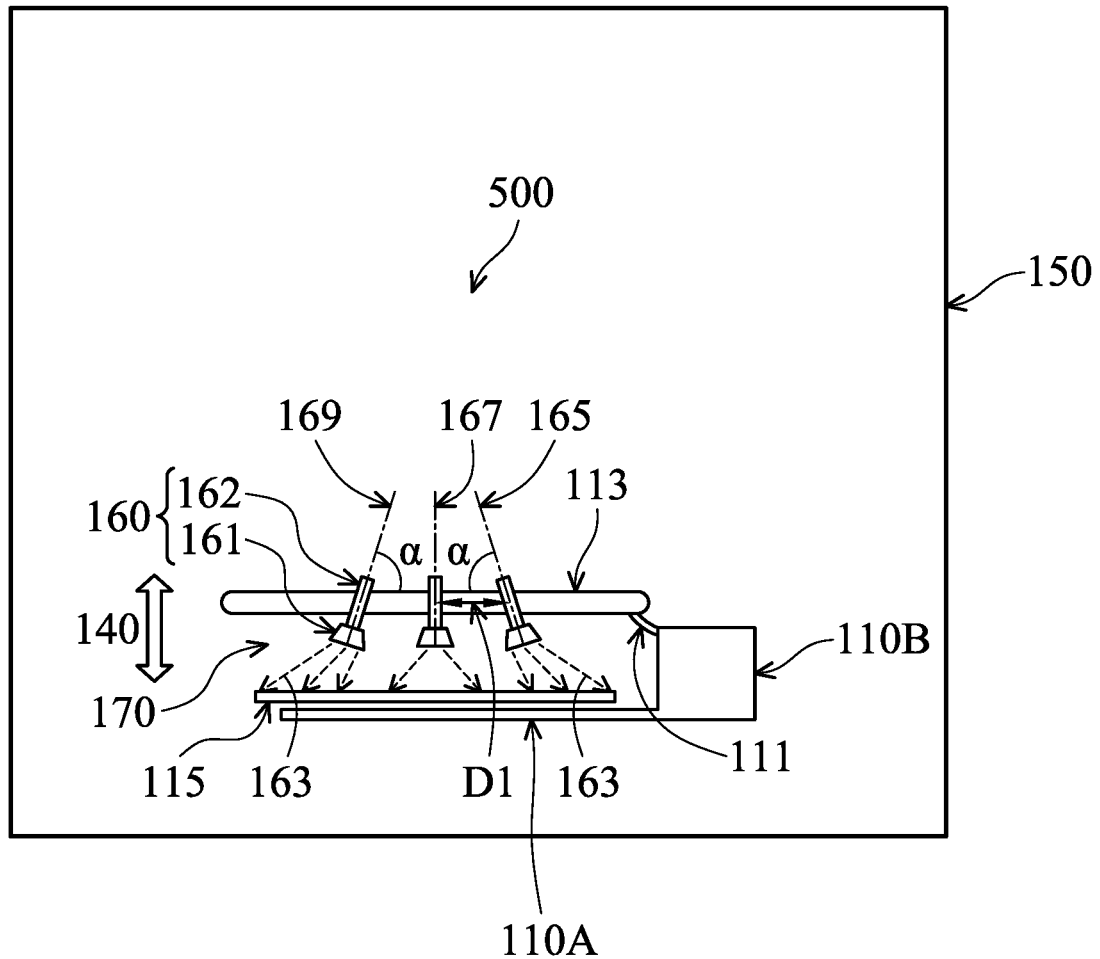
Figure 5B:
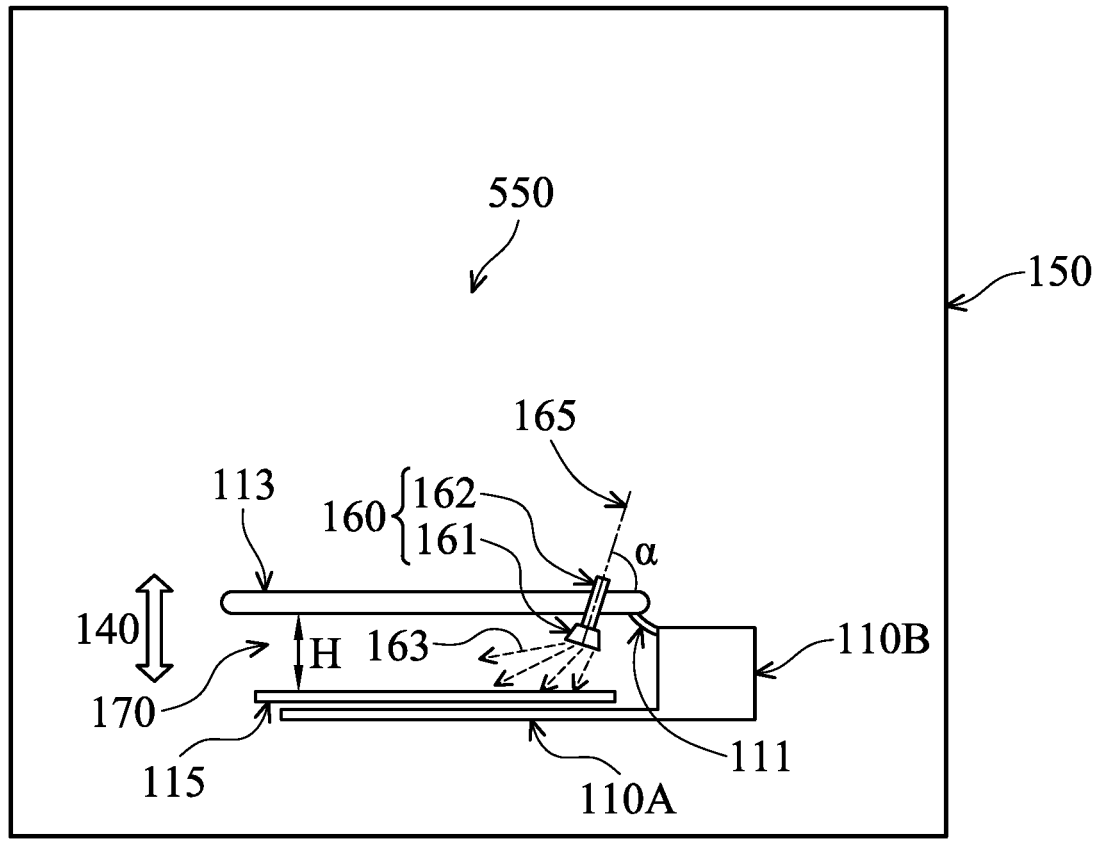

FIGS. 5A and 5B illustrate the side views of production tools 500 and 550 disposed in a chamber 150, respectively, in some embodiments. Similar numerals in FIGS. 5A and 5B denote similar components as in FIG. 4. For example, the shield 113 in FIG. 5A is similar to the shield 113 in FIG. 4.

As illustrated in FIGS. 5A and 5B, the production tool (e.g., 500 or 550) includes a robot arm 110 (e.g., 110A/110B) and a shield 113. The robot arm 110 has an arm 110A attached to a base 110B, and the shield 113 is attached to the robot arm 110, in some embodiments. The robot arm 110, the shield 113, and the wafer 115 are disposed in a chamber 150 which provides a clean room environment for semiconductor manufacturing. The shield 113 may have any suitable shapes, such as a circular shape, a polygon shape, an oval shape, an elliptical shape, a semi-circle shape, the like, or combinations therefore. Details of the shield 113 are discussed above with reference to FIGS. 1-3, thus are not repeated here.

The production tools 500 and 550 are similar to the production tool 400 in FIG. 4, with the addition of one or more injectors 160 embedded in the shield 113, where the injectors 160 comprise injector supply pipes 162 and injector heads 161. As illustrated in FIGS. 5A and 5B, the injector supply pipes 162 extend through the shield 113, and the injector heads 161, which may comprise multiple openings (not shown) oriented at different angles, are attached to respective injector supply pipes 162. In some embodiments, a gas is injected into the gap 170 between the shield 113 and the wafer 115 via the one or more injectors 160, and the injected gas flows across the surface (e.g., the upper surface facing the shield 113) of the wafer 115. The gas flow may blow dust particles away from the wafer 115, thus reducing the amount of dust particles on the wafer 115. The gas supplied to the one or more injectors 160 may be any suitable gas. For example, an inert gas such as $N_2$, Ar, the like, or combinations therefore may be used. As another example, clean air (e.g., filtered air with dust particles having sizes and concentration levels below certain allowed thresholds) may be used as the gas supplied to the injectors 160.

The openings of each of the injector head 161 are oriented to generate gas flow along pre-determined directions (e.g., directions indicated by arrows 163). In addition, an angle α (see FIG. 5A and FIG. 5B) between the center axis (e.g., 165 and 169 in FIG. 5A) of the injector 160 and the upper surface of the shield 113 may be designed to facilitate gas flow along the pre-determined directions. In some embodiments, the gas injected into the gap 170 flows from a center region (e.g., a region proximate the center of the wafer 115) of the gap 170 toward perimeter regions (e.g., regions proximate the edge of the wafer 115) of the gap 170, as illustrated by arrows 163 in FIG. 5A. In other embodiments, the gas injected into the gap 170 flows from a first perimeter region of the gap 170 to a second perimeter region of the gap 170 opposing the first perimeter region, such as illustrated by arrows 163 in FIG. 5B. The number of injectors, the location of the injectors, the angle α between the center axes of the injectors and the upper surface of the shield 113, and the design of the openings in the injector head may be adjusted in accordance with various factors such as the size of the wafer 115, the size of the shield 113, the configuration of the robot arm 110. These and other variations of the production tool (e.g., 500, 550) are fully intended to be included within the scope of the present disclosure.

FIG. 5A illustrates a center injector 160 (with a center axis 167 along a longitudinal direction of the center injector 160) and two outer injectors 160 (with center axes 165 and 169 along the longitudinal directions of the outer injectors 160) disposed in a center region of the shield 113. The center injector 160 may be disposed in a center of the shield 113, and each of the outer injectors 160 may be a distance D1 away from the center injector 160. In some embodiments, the distance D1 is less than one third of the width W1 (see FIG. 1) of the shield 113. Although not shown in FIG. 5A, there may be additional outer injectors 160 disposed around the center injector 160, e.g., disposed along a circle around the center injector 160 with the two outer injectors 160 shown in FIG. 5A from a top view of the production tool 500.

Still referring to FIG. 5A, the injectors 160 may be arranged to facilitate air flow along directions from the center region of the gap 170 to perimeter regions of the gap 170. For example, the center axis 167 of the center injector 160 may be perpendicular to the upper surface of the shield 113, and the two outer injectors 160 may have axes 165 and 169 that form an acute angle α with the upper surface of the shield 113. In some embodiments, the angle α is between about 30 degrees to about 60 degrees, although other values are also possible. Tilting the center axes 165 and 169 of the two outer injectors 160 may facilitate the air flow along the directions indicated by arrows 163. In some embodiments, the center injector 160 is omitted, and the outer injectors 160 are used to generate gas flow from the center region of the gap 170 to the perimeter regions of the gap 170.

FIG. 5B illustrates the side view of another embodiment product tool 550 with one or more injectors 160. In the illustrated embodiment, the injector 160 is disposed proximate a perimeter of the shield 113. In some embodiments, the angle α between the center axis 165 of the injector 160 and an upper surface of the shield 113 is an acute angle. The angle α is between about 15 degrees to about 45 degrees, in some embodiments, although other values are also possible. The location and the angle α of the injector 160 may be determined to facilitate gas flow from a first perimeter region of the gap 170 (e.g., the right perimeter region of gap 170) to a second perimeter region of the gap 170 (e.g., the left perimeter region of gap 170) opposing the first perimeter region. Although one injector 160 is illustrated in FIG. 5B, there may be more than one injectors 160 disposed along the perimeter of the shield 113. For example, in a top view, the one or more injectors 160 may be disposed along an arc that is a portion (e.g., less than one third) of a circle. As another example, in a top view, the one or more injectors 160 may be disposed along a straight line proximate the perimeter of the shield 113. In some embodiments, all injectors 160 are disposed within a first portion (e.g., less than one third) of the shield 113 proximate the perimeter of the shield 113 in a top view, and no injector is disposed outside the first portion of the shield 113.

In addition, the distance H (see, e.g., FIG. 5B) between the shield 113 and the arm 110A of the robot arm 110 of the production tools 500 and 550 may be adjusted along the direction indicated by the arrow 140, as discussed above with reference to FIG. 4. As an example, the distance H may have a larger value (e.g., about 3 cm) when loading and unloading the wafer 115, and the distance H may have a smaller value (e.g., less than 1 cm, such as less than about 0.5 cm) after loading the wafer 115 and during transportation of the wafer 115. Details are similar to those discussed above with reference to FIG. 4, thus are not repeated here.

Figure 6:
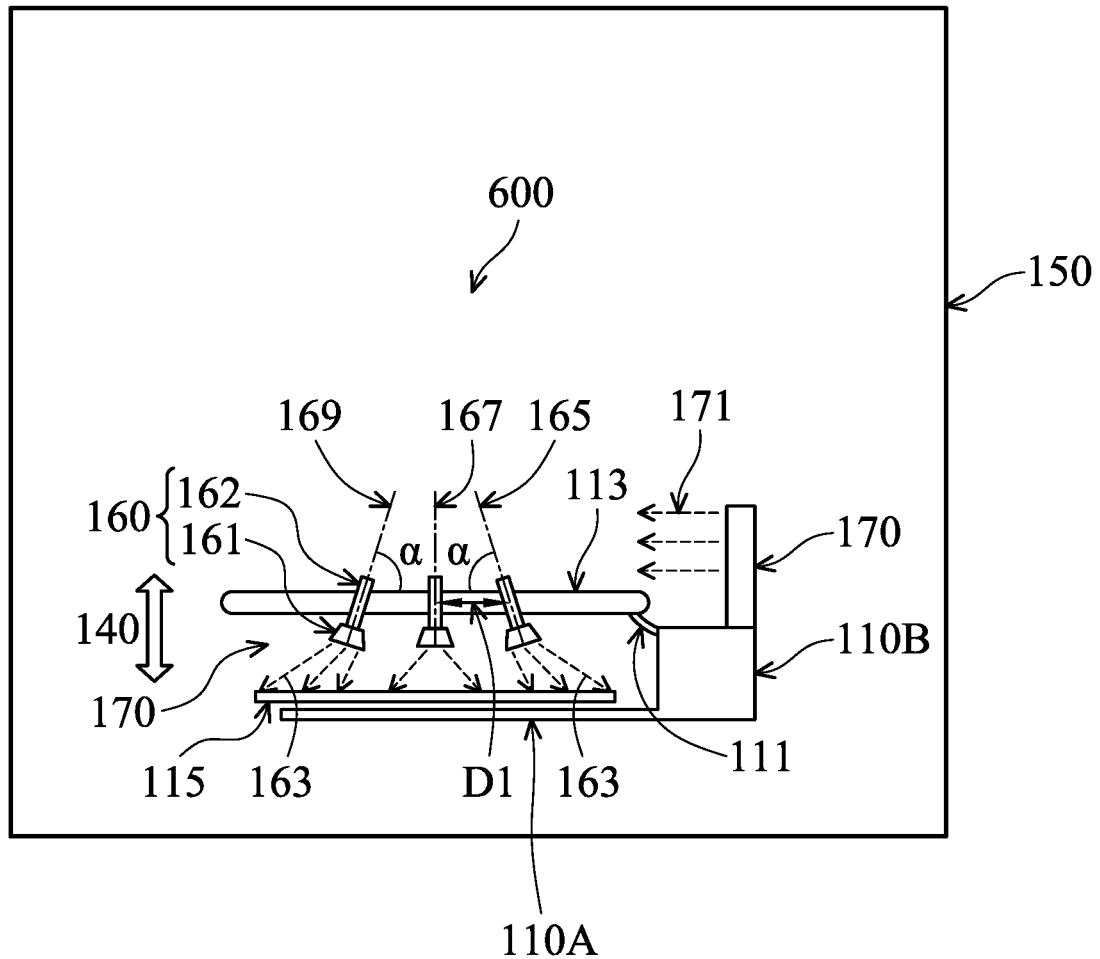

FIG. 6 illustrates a side view of a production tool 600 disposed in a chamber 150, in some embodiments. Similar numerals in FIG. 6 denote similar components as in FIG. 5A.

As illustrated in FIG. 6, the production tool 600 includes a robot arm 110 (e.g., 110A/110B) and a shield 113. The robot arm 110 has an arm 110A attached to a base 110B, and the shield 113 is attached to the robot arm 110, in some embodiments. The robot arm 110, the shield 113, and the wafer 115 are disposed in a chamber 150 which provides a clean room environment for semiconductor manufacturing. The shield 113 may have any suitable shapes, such as a circular shape, a polygon shape, an oval shape, an elliptical shape, a semi-circle shape, the like, or combinations therefore. Details of the shield 113 are discussed above with reference to FIGS. 1-3, thus are not repeated here.

The shield 113 in FIG. 6 may move up and down along the direction indicated by the arrow 140, and injectors 160 may be supplied with gas to create gas flow across the surface of the wafer 115. Details are discussed above with reference to FIGS. 4, 5A and 5B, thus are not repeated here. Note that the configuration (e.g., number of injectors, injector locations and angle α) of injectors 160 in FIG. 6 is similar to that of FIG. 5A, however, other configurations for the injectors 160, such as the configuration illustrated in FIG. 5B, may also be used. These and other variations are fully intended to be included within the scope of the present disclosure.

As illustrated in FIG. 6, the production tool 600 has an air ionizer 170 (e.g., an electrostatic discharge (ESD) ionizer) attached to the robot arm 110. The air ionizer 170 is attached to the base 110B in FIG. 6, but may be attached to other locations of the robot arm 110. The air ionizer 170 produces ions, such as positive ions and negative ions, which are distributed across the tool area (e.g., over the shield 113) along directions such as directions 171. The ions from the ionizer 170 neutralizes the static charge accumulated on the production tool 600 (e.g., shield 113, robot arm 110), thus reducing the build-up of the static charge and reducing the number of dust particles on the wafer 115, in some embodiments.

Figure 7:
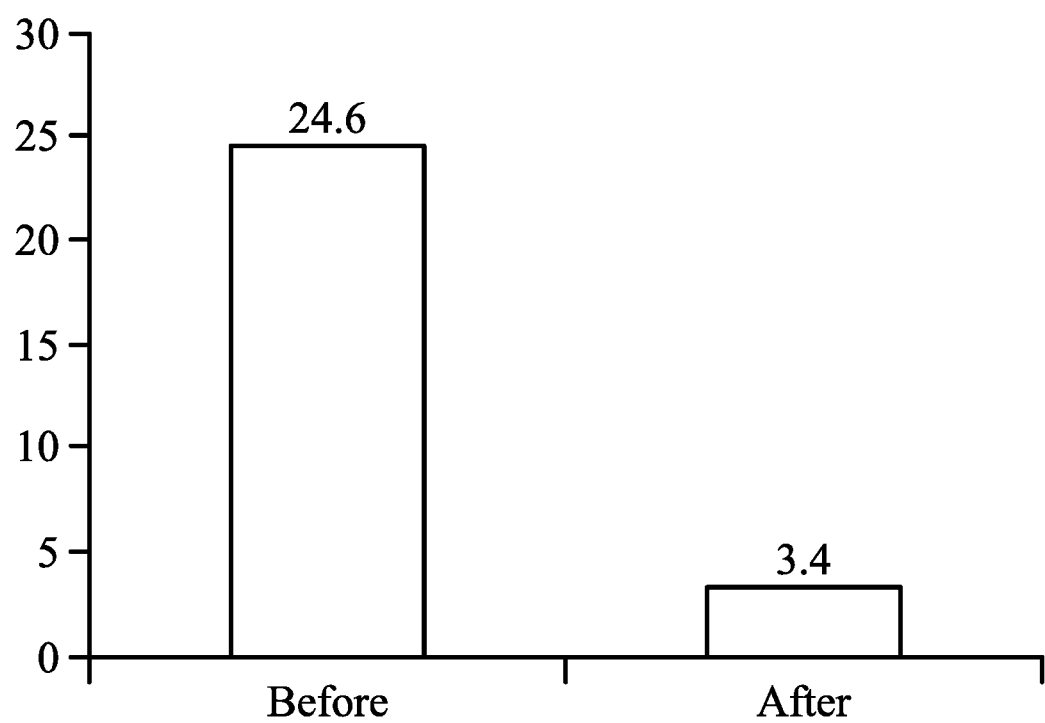
FIG. 7 illustrates a performance comparison between an embodiment production tool and a conventional tool, in accordance with an embodiment.

FIG. 7 illustrates the performance comparison of the production tool 100 (labeled as "After") with a conventional production tool (labeled as "Before") without the shield 113. In particular, the bar diagram shows the average number of dust particles on the wafer surface for production tools with and without the shield 113. Dust particles with sizes larger than 0.026 μm were counted in the performance comparison of FIG. 7. The wafers used in the test have diameters of 12 inch, and the average numbers of dust particles found on the wafer surface are reported. As shown in FIG. 7, there is an over 80% reduction in the number of dust particles on the wafer surface due to the use of the shield 113.

Figure 8:
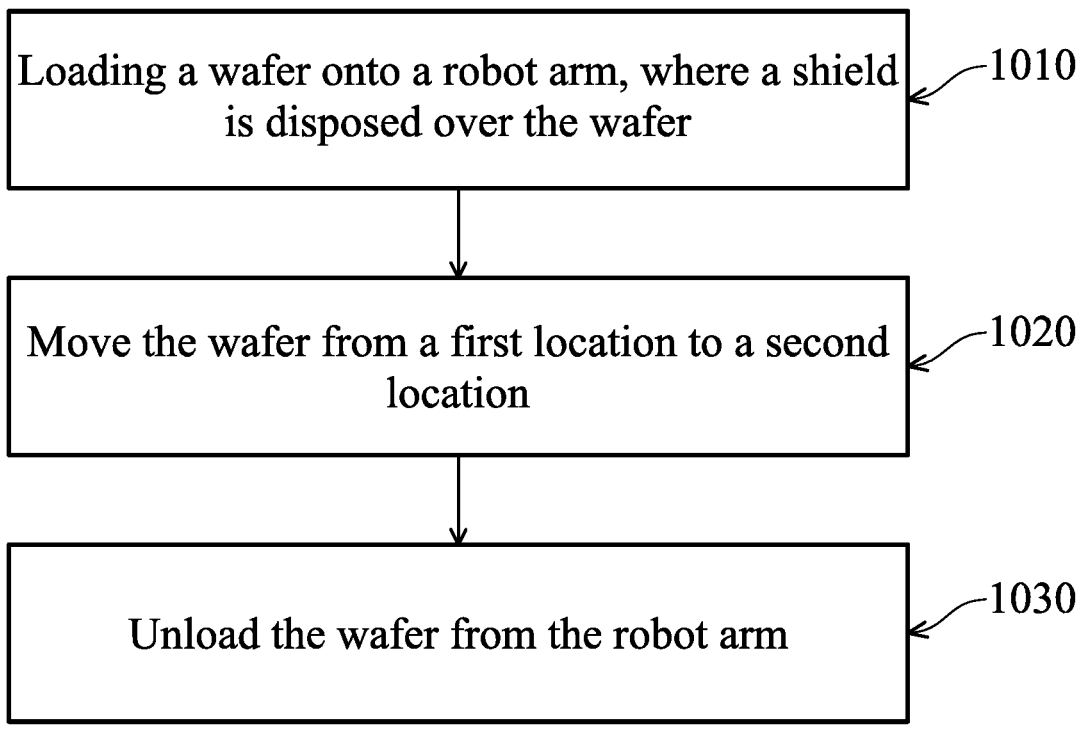
FIG. 8 illustrates a flow chart for a method of operating a production tool, in some embodiments.

FIG. 8 illustrates a flow chart of a method 1000 for using a semiconductor tool, in accordance with some embodiments. It should be understood that the embodiment method shown in FIG. 8 is merely an example of many possible embodiment methods. One of ordinary skill in the art would recognize many variations, alternatives, and modifications. For example, various steps as illustrated in FIG. 8 may be added, removed, replaced, rearranged and repeated.

Referring to FIG. 8, at step 1010, a wafer is loaded onto a robot arm, where a shield is disposed over the wafer. At step 1020, the wafer is moved from a first location to a second location. At step 1030, the wafer is unloaded from the robot arm.

Advantageous features of some embodiments described herein include the ability to reduce the number of dust particles falling on the wafer surfaces during semiconductor manufacturing, thereby reducing device failure rate and improving production yield. Besides protecting the wafers from dust, the disclosed shield 113 may be used for other applications where protection from dust particles would be beneficial. For example, the shield 113 may also be used in panel process to reduce dust-related defects and to improve production yield.

In some embodiments, a semiconductor production tool includes a robot arm having an arm and a base, where the arm is connected to the base and is configured to hold a wafer. The semiconductor production tool further includes a shield attached to the robot arm and configured to be disposed over the wafer, where the shield has a first surface area larger than a second surface area of the wafer.

In other embodiments, a method includes loading a wafer onto a robot arm, wherein a shield is disposed over the wafer, moving the wafer from a first location to a second location, and unloading the wafer from the robot arm.

In yet other embodiments, a method includes reducing a distance between a shield and a wafer from a first value to a second value smaller than the first value, where the wafer is held by a robot arm, where the shield is disposed over the wafer and comprises a non-static material, and where the shield has a first area larger than a second area of the wafer in a top view. The method also includes moving the wafer from a first location to a second location, increasing the distance between the shield and the wafer to a third value larger than the second value, and removing the wafer from the robot arm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    loading a wafer onto a robot arm, wherein the robot arm has a shield attached thereto, wherein the shield is disposed over the wafer, the shield having a first surface area larger than a second surface area of the wafer, wherein the shield comprises an anti-static material;
    moving the wafer from a first location to a second location; and
    unloading the wafer from the robot arm.

2. The method of claim 1, wherein the shield further comprises a substrate, wherein the anti-static material covers exterior surfaces of the substrate.

3. The method of claim 1, wherein the shield has a circular shape in a plan view.

4. The method of claim 1, wherein in a plan view, the shield has a polygon shape with rounded corners.

5. The method of claim 4, wherein a radius of the rounded corners is larger than about 5 mm.

6. The method of claim 1, further comprising:
    lowering the shield toward the wafer after loading the wafer; and
    raising the shield away from the wafer before unloading the wafer.

7. The method of claim 1, further comprising injecting a gas in a gap between the shield and the wafer.

8. The method of claim 7, wherein the injected gas flows from a center region of the gap toward perimeter regions of the gap.

9. The method of claim 7, wherein the injected gas flows from a first perimeter region of the gap toward a second perimeter region of the gap opposing the first perimeter region.

10. The method of claim 1, further comprising:
    generating ions using an ionizer; and
    distributing the ions over the shield.

11. The method of claim 1, wherein the anti-static material is indium tin oxide, a conductive fiber, a conductive polymer, a nanomaterial, or combinations thereof.

12. A method comprising:
    reducing a distance between a shield and a wafer from a first value to a second value smaller than the first value, wherein the shield comprises an anti-static material, wherein the wafer is held by a robot arm, and the shield is disposed over the wafer;
    moving the wafer from a first location to a second location after reducing the distance;
    increasing the distance between the shield and the wafer to a third value larger than the second value after the wafer is moved to the second location; and
    removing the wafer from the robot arm after increasing the distance.

13. The method of claim 12, wherein the shield has a larger surface area than the wafer.

14. The method of claim 12, wherein the first value is about 3 cm, and the second value is smaller than about 0.5 cm.

15. The method of claim 12, further comprising injecting a gas into a gap between the shield and the wafer using one or more injectors.

16. The method of claim 15, wherein the one or more injectors comprise a first injector with a first center axis, wherein the first center axis forms an acute angle with an upper surface of the shield distal from the wafer.

17. The method of claim 16, wherein the one or more injectors further comprise a second injector with a second center axis, wherein the second center axis is perpendicular to the upper surface of the shield.

18. A method comprising:
    loading a wafer onto a robot arm;
    positioning a shield over the wafer, the shield comprising an anti-static material; and
    transferring the wafer from a first location to a second location with the shield positioned over the wafer.

19. The method of claim 18, wherein the shield is attached to the robot arm through an adjustable mechanism, wherein a distance between the shield and the wafer has a first value before the wafer is loaded onto the robot arm, wherein the method further comprises:
 before transferring the wafer, reducing the distance between the shield and the wafer to a second value smaller than the first value using the adjustable mechanism.

20. The method of claim 19, further comprising,
 increasing the distance between the shield and the wafer to a third value larger than the second value after the wafer is transferred to the second location; and
 unloading the wafer from the robot arm.

* * * * *